US010847350B2

(12) United States Patent
Kanno

(10) Patent No.: US 10,847,350 B2
(45) Date of Patent: Nov. 24, 2020

(54) HEAT TREATMENT APPARATUS

(71) Applicant: TOKYO ELECTRON LIMITED, Tokyo (JP)

(72) Inventor: Soichi Kanno, Oshu (JP)

(73) Assignee: TOKYO ELECTRON LIMITED, Tokyo (JP)

(*) Notice: Subject to any disclaimer, the term of this patent is extended or adjusted under 35 U.S.C. 154(b) by 1234 days.

(21) Appl. No.: 14/974,159

(22) Filed: Dec. 18, 2015

(65) Prior Publication Data
US 2016/0177450 A1 Jun. 23, 2016

(30) Foreign Application Priority Data

Dec. 22, 2014 (JP) .................. 2014-258952

(51) Int. Cl.
H01J 37/32 (2006.01)
C23C 16/40 (2006.01)
(Continued)

(52) U.S. Cl.
CPC ...... H01J 37/32724 (2013.01); C23C 16/402 (2013.01); C23C 16/4586 (2013.01);
(Continued)

(58) Field of Classification Search
CPC ............ C23C 16/402; C23C 16/45536; C23C 16/45551; C23C 16/46; C23C 16/4586;
(Continued)

(56) References Cited

U.S. PATENT DOCUMENTS 6,436,796 B1* 8/2002 Mailho .................. C23C 16/46
438/478
2004/0112293 A1* 6/2004 Kinei .................. C23C 16/4584
118/725
(Continued)

FOREIGN PATENT DOCUMENTS

JP H05006833 U 1/1993
JP H08260152 A 10/1996
(Continued)

OTHER PUBLICATIONS

English Machine Translation of KR20060012531 Son retrieved from ESPACENET Jun. 13, 2019 (Year: 2019).*

Primary Examiner — Rakesh K Dhingra
Assistant Examiner — Laureen Chan
(74) Attorney, Agent, or Firm — Nath, Goldberg & Meyer; Jerald L. Meyer

(57) ABSTRACT

A heat treatment apparatus includes: a rotation table installed in a vacuum container, the rotation table mounting a substrate in a mounting area formed in one surface side of the rotation table and revolving the substrate; a heater that heats the rotation table; a plasma processing part that generates a plasma in a plasma generation region, which is formed in the one surface side of the rotation table at a region through which the substrate passes, and processes the substrate; a temperature measurement terminal installed in the rotation table at a region, which passes through a position facing the plasma generation region when the rotation table is rotated, the temperature measurement terminal outputting a temperature measurement result of the rotation table as an electric signal; and a conductive plasma shield part installed to cover the temperature measurement terminal when viewed from the plasma generation region.

11 Claims, 11 Drawing Sheets

(51) Int. Cl.
*H01L 21/67* (2006.01)
*H01L 21/687* (2006.01)
*C23C 16/455* (2006.01)
*C23C 16/46* (2006.01)
*C23C 16/458* (2006.01)

(52) U.S. Cl.
CPC .. *C23C 16/45536* (2013.01); *C23C 16/45551* (2013.01); *C23C 16/46* (2013.01); *H01J 37/32715* (2013.01); *H01L 21/67248* (2013.01); *H01L 21/68764* (2013.01); *H01L 21/68771* (2013.01)

(58) Field of Classification Search
CPC ............... C23C 16/4584; C23C 16/50; H01L 21/68771; H01L 21/67103; H01L 21/67248; H01L 21/68764–68792; H01J 37/32724; H01J 37/321; H01J 37/32715; G01K 1/08
See application file for complete search history.

(56) References Cited

U.S. PATENT DOCUMENTS

| | | | | |
|---|---|---|---|---|
| 2008/0092817 | A1* | 4/2008 | Kappeler | C23C 16/46 118/723 E |
| 2008/0190357 | A1* | 8/2008 | Karlsson | C23C 16/4584 117/200 |
| 2009/0022205 | A1* | 1/2009 | Comendant | G01K 1/143 374/161 |
| 2011/0155057 | A1* | 6/2011 | Kato | C23C 16/45519 118/719 |
| 2012/0221167 | A1* | 8/2012 | Hong | C23C 16/46 700/300 |
| 2014/0087567 | A1* | 3/2014 | Toyoda | C23C 16/44 438/782 |
| 2014/0170859 | A1* | 6/2014 | Yamawaku | H01L 21/68764 438/778 |
| 2016/0148803 | A1* | 5/2016 | Wu | C23C 16/46 438/479 |

FOREIGN PATENT DOCUMENTS

| | | | |
|---|---|---|---|
| JP | 2004119707 A | | 4/2004 |
| JP | 2004/207687 A | | 7/2004 |
| JP | 2005147976 A | | 6/2005 |
| JP | 2011/258614 A | | 12/2011 |
| JP | 2013222948 A | | 10/2013 |
| KR | 20060012531 A | * | 2/2006 |
| KR | 1020130118265 A | | 10/2013 |

* cited by examiner

HEAT TREATMENT APPARATUS

CROSS-REFERENCE TO RELATED APPLICATION

This application claims the benefit of Japanese Patent Application No. 2014-258952, filed on Dec. 22, 2014, in the Japan Patent Office, the disclosure of which is incorporated herein in its entirety by reference.

TECHNICAL FIELD

The present disclosure relates to a technique of measuring a temperature of a rotation table when a heat treatment is conducted on a substrate mounted on the rotation table.

BACKGROUND

As a heat treatment apparatus for conducting a treatment by heating a substrate, there is a film forming apparatus that forms a thin film on a heated substrate. In the film forming apparatus, for example, a plurality of substrates is mounted on a rotation table disposed in a vacuum container so that the substrates surround a rotation axis of the rotation table, and a gas supply region is formed so as to supply a processing gas to a predetermined position in an upper side of the rotation table. In this film forming apparatus, when the rotation table is rotated, each substrate repeatedly passes through the gas supply region while revolving about the rotation axis and the processing gas reacts on surfaces of the substrate. Therefore, film formation is conducted.

In a lower side of the rotation table, a heater as a heating part is installed. By heating the rotation table using thermal radiation (radiation heat) from the heater, the substrate mounted on the upper surface of the rotation table is heated, whereby reaction of the processing gas proceeds. A temperature control of the substrate, which affects the progress of the reaction, is performed by adjusting the temperature of the rotation table. Therefore, in order to properly perform the temperature control of the substrate, it is necessary to precisely measure the temperature of the rotation table.

Here, a thermometer normally used has a configuration in which a small-sized metallic temperature measurement part (hereinafter, referred to as a "temperature measurement terminal"), such as a thermocouple, a resistance temperature detector, or the like, is in contact with a temperature measurement target and the temperature measurement result is output as an electric signal.

In the aforementioned film forming apparatus, in some cases, a gas converted into plasma is supplied to the surface of the substrate, thereby modifying the film formed on the substrate. If a small-sized metal, such as the temperature measurement terminal, is disposed in an atmosphere where the plasma is formed, there is a possibility that abnormal discharge is generated towards the temperature measurement terminal having a pointed shape in comparison with the plate-shaped rotation table, which results in a bad influence on the substrate.

Moreover, when the result of the temperature measurement in the temperature measurement terminal is output as the electric signal, the electric signal may be affected by the plasma. In such a case, a correct temperature measurement result is not obtained.

A plasma processing apparatus can be used, wherein a wafer is mounted on a sample mounting table fixedly disposed within a vacuum container and film formation is performed on the wafer by using plasma. In this plasma processing apparatus, in addition to including the sample mounting table as above, a temperature sensor such as a thermocouple, a resistance temperature detector, or the like is installed in a metallic base where a high-frequency bias power supply for attracting charged particles within the plasma is connected.

However, the temperature sensor is inserted in an interior of a hole formed in the lower surface side of the base, and a sintered ceramic plate embedding a dielectric film, a heater electrode film, or an electrode film for electrostatic attraction is stacked in the upper surface side of the base. By this configuration, the plasma formed in the upper side of the wafer and the temperature sensor are sufficiently insulated from each other. Therefore, the problem in that abnormal discharge is generated towards the temperature sensor, or in that the electric signal output as the temperature measurement result is affected by the plasma, hardly occurs.

A metal organic chemical vapor deposition (MOCVD) apparatus can also been used. In the MOCVD apparatus, a wafer is mounted on a rotation disc rotating about a shaft and is heated by a heater installed in an upper side of a rotation disc while introducing a material gas from a material gas inlet port installed in an upper side of a center of the rotation and diffusing the material gas in the upper surface of the rotation disc, thereby performing a film formation.

In the MOCVD apparatus, a thermocouple is buried in the rotation disc so that the thermocouple is adjacent to or in contact with a rear surface of the wafer. With this configuration, the temperature measurement of the wafer is performed. However, covering the upper surface of the thermocouple with the wafer is merely a placing of a distance of "wafer thickness× relative dielectric constant of silicon (about 12)" (e.g., when the wafer thickness is 0.7 mm, the wafer is distanced from the plasma by about 8 mm) between the plasma and the thermocouple. Thus, the thermocouple is not sufficiently shielded from the plasma. Accordingly, there is a high possibility that a precise temperature measurement result (an electric potential difference in a case of using the thermocouple) is not output. Also, there is a possibility that abnormal discharge enters the thermocouple from the rear surface of the wafer.

SUMMARY

The present disclosure provides a heat treatment apparatus capable of measuring a temperature of a rotation table while suppressing abnormal discharge generated by plasma.

According to an embodiment of the present disclosure, there is provided a heat treatment apparatus that performs a heat treatment with respect to a substrate. The heat treatment apparatus includes: a rotation table installed in a vacuum container, the rotation table mounting the substrate in a mounting area formed in one surface side of the rotation table and revolving the substrate; a heater that heats the rotation table; a plasma processing part that generates a plasma in a plasma generation region, which is formed in the one surface side of the rotation table at a region through which the substrate passes, and processes the substrate; a temperature measurement terminal installed in the rotation table at a region, which passes through a position facing the plasma generation region when the rotation table is rotated, the temperature measurement terminal outputting a temperature measurement result of the rotation table as an electric signal; and a plasma shield part installed to cover the temperature measurement terminal when viewed from the plasma generation region, the plasma shield part being made of a conductor.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As an embodiment of a heat treatment apparatus of the present disclosure, description will be made on a film forming apparatus 1 that forms a $SiO_2$ film with respect to a wafer W as a substrate by atomic layer deposition (ALD). In the ALD method conducted in the film forming apparatus 1 of this example, after adsorbing a BTBAS ((bistertiary-butylamino)silane) gas as a source gas containing silicon (Si) to the wafer W, an ozone gas ($O_3$) as an oxidizing gas which oxidizes the BTBAS, is supplied to a surface of the wafer W, whereby a molecular layer of $SiO_2$ (oxidized silicon) is formed. After that, the wafer W is exposed to plasma generated from a plasma generating gas, and a process for modifying the molecular layer is performed. By repeatedly performing a series of the above processes several times with respect to one sheet of the wafer W, the $SiO_2$ film is formed. The source gas or the oxidizing gas corresponds to a processing gas of the present embodiment.

Figure 1:
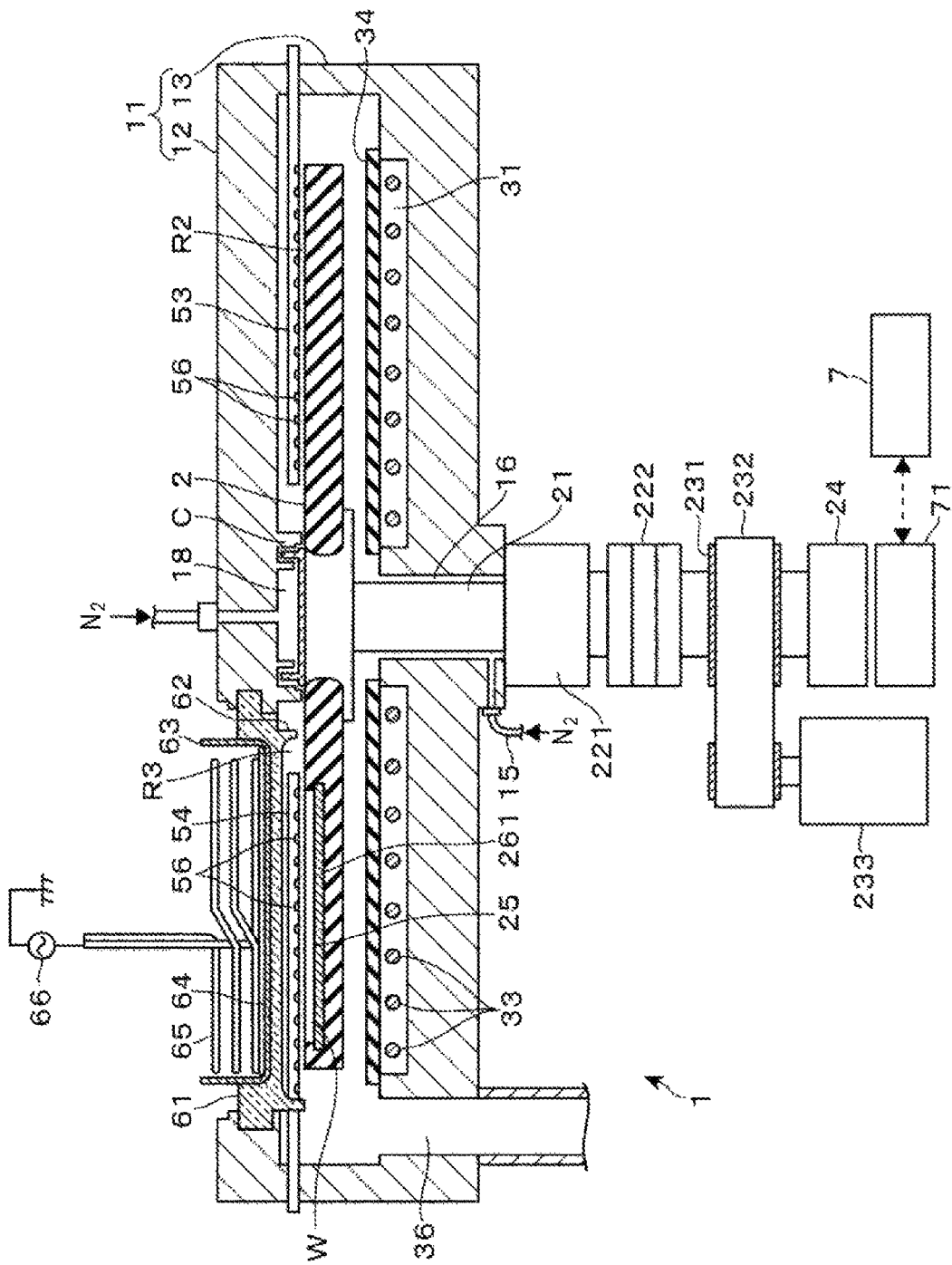
FIG. 1 is a vertical sectional side view of a film forming apparatus according to an embodiment of the present disclosure.
Figure 2:
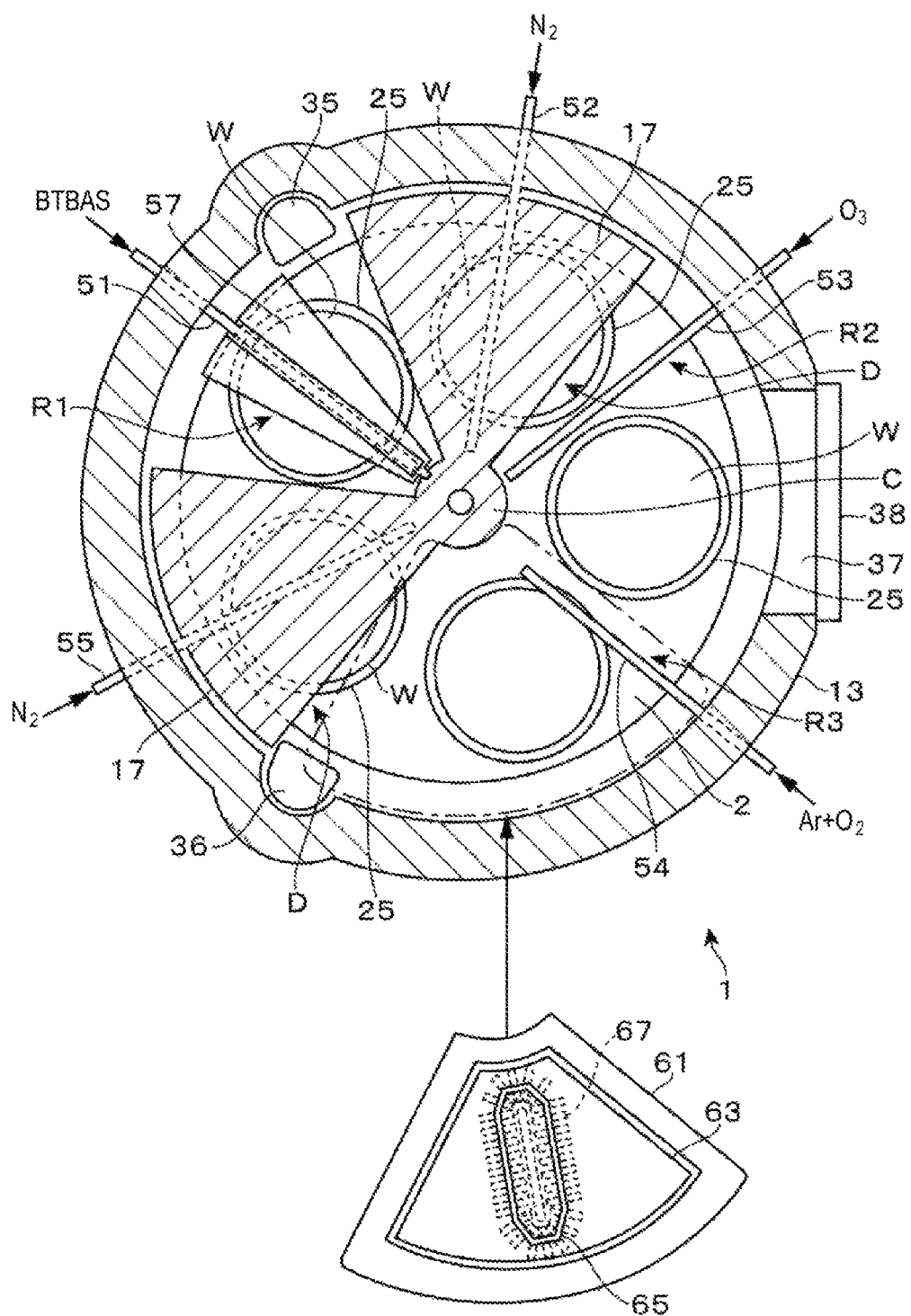
FIG. 2 is a horizontal sectional plan view of the film forming apparatus.

As shown in FIGS. 1 and 2, the film forming apparatus 1 includes a substantially circular flat vacuum container 11, and a disc-shaped rotation table 2 installed within the vacuum container 11. The vacuum container 11 is constituted by a ceiling plate 12 and a container body 13 forming a side wall and a lower part of the vacuum container 11.

The rotation table 2 is made of, for example, a quartz glass (hereinafter, simply referred to as "quartz"), and a metallic rotation shaft 21 extending vertically downward is installed in a central part thereof. The rotation shaft 21 is inserted to an opening part 16 formed in the lower part of the container body 13, and protrudes from a lower surface of the container body 13 and outside of the vacuum container 11 through a magnetic seal 221 installed to airtightly seal a lower end portion of the opening part 16. In an outside protrusion portion of the rotation shaft 21, a feed through 222, through which an electric signal wiring between the vacuum container 11 kept in a vacuum atmosphere and the outside passes, and a pulley 231 are installed.

A driving motor 233 is installed in a side of the rotation shaft 21. A driving part of the rotation table 2 is constituted by winding a driving belt 232 so as to couple the pulley 231 and a rotation axis of the driving motor 233.

In a lower end portion of the rotation shaft 21, a temperature detection unit 24, which executes communication of information on a temperature of the rotation table 2 between a reception power supply unit 71 to be described later, is installed.

The rotation table 2 is horizontally supported by the rotation shaft 21 within the vacuum container 11. If the rotation shaft 21 is rotated by an act of the driving motor 233, the rotation table 2 rotates, for example, in a clockwise direction when viewed from top.

In the lower end portion of the opening part 16, in order to suppress wraparound of the source gas, oxidizing gas, or the like from an upper surface side of the rotation table 2 to a lower surface side thereof, a gas supply pipe 15 supplying a nitrogen ($N_2$) gas to a gap between the opening part 16 and the rotation shaft 21 is installed.

In a lower surface of the ceiling plate 12 constituting the vacuum container 11, a central region C and protrusion portions 17 are formed (FIG. 2). The central region C protrudes towards and faces a central portion of the rotation table 2, and has a circular ring shape when viewed from top. The protrusion portions 17 are formed to widen from the central region C toward the outside of the rotation table 2, so that the protrusion portions 17 have a fan shape when viewed from the top. In other words, the central region C and the protrusion portions 17 form a ceiling surface lower than an outer region thereof in the lower surface of the ceiling plate 12.

A gap between the central region C and the central portion of the rotation table 2 constitutes a flow path 18 of a $N_2$ gas. The $N_2$ gas is supplied to the flow path 18 from a gas supply pipe connected to the ceiling plate 12. The $N_2$ introduced into the flow path 18 is discharged from a gap between the upper surface of the rotation table 2 and the central region C radially outside of the rotation table 2 over the entire circumference of the gap. The $N_2$ gas prevents the source gas and the oxidizing gas, which are supplied from different positions in the rotation table 2 (an adsorption region R1 and an oxidation region R2 which will be described later), from making contact with each other by virtue of the central portion (the flow path 18) of the rotation table 2 as a bypass.

Figure 3:
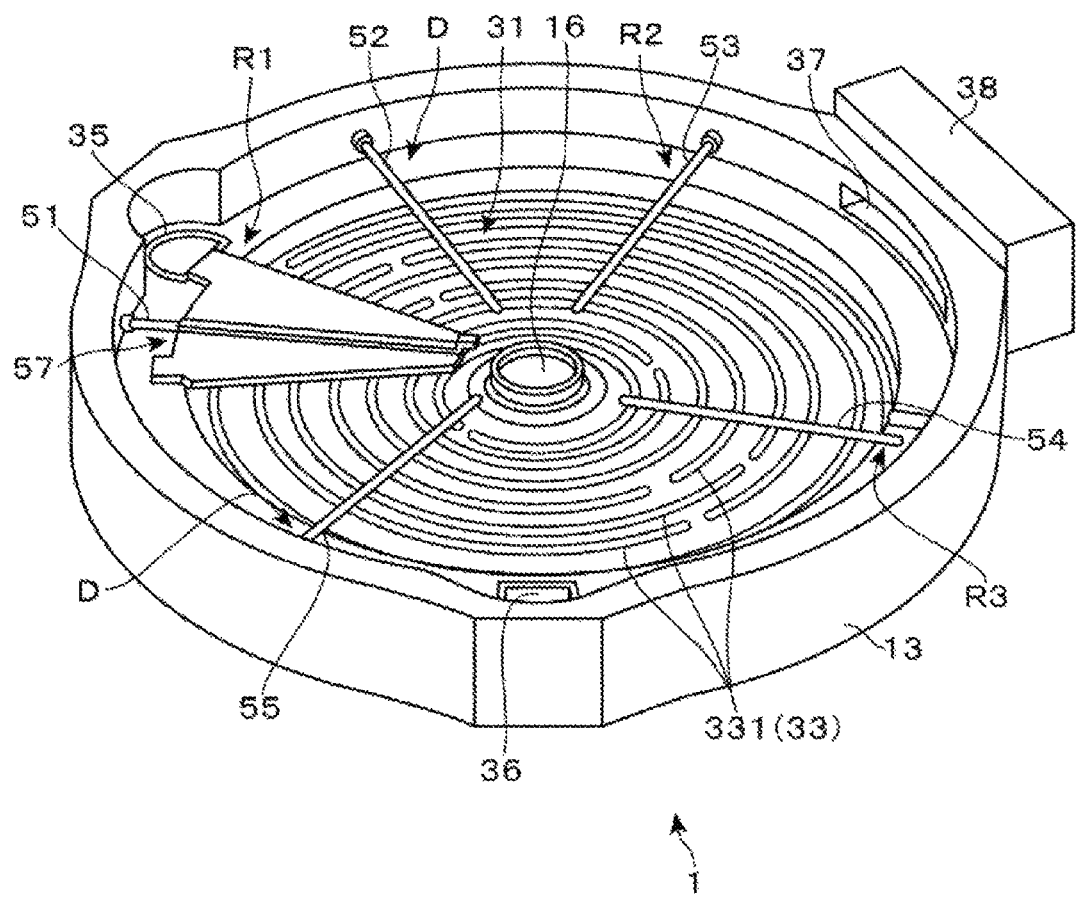
FIG. 3 is an exploded perspective view illustrating an internal structure of the film forming apparatus.

The perspective view of FIG. 3 shows a state where the ceiling plate 12 and the rotation table 2 are removed from the film forming apparatus 1. As illustrated in FIG. 3, in a lower surface of the container body 13 positioned below the rotation table 2, a flat annular concave portion 31 is formed along the circumferential direction of the rotation table 2. In a lower surface of the concave portion 31, a heater 33 as a heating part, is installed over an area facing the entire lower surface of the rotation table 2.

Figure 4:
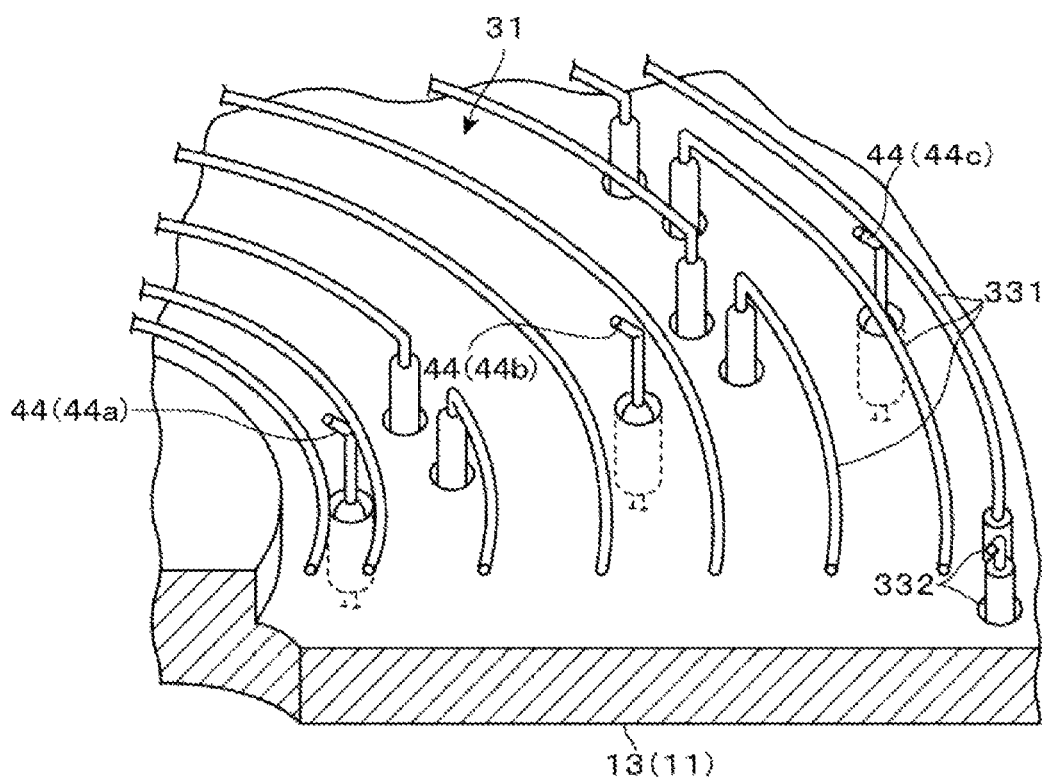
FIG. 4 is an enlarged exploded perspective view of a heater installation region.

For example, as illustrated in FIG. 4, the heater 33 is constituted by combining a plurality of heater elements 331, each of which is a long and narrow tubular carbon wire heater formed in an arc shape having a length of, for example, from about 10 cm to tens of centimeters. By combining a plurality of the arc-shaped heater elements 331, the heater 33 is installed in the concave portion 31 so as to form a plurality of concentric circles centered on the rotation shaft 21.

In the concave portion 31 where the heater 33 is installed, a plurality of, e.g., three, thermocouples 44 (44a to 44c: heating part thermometers), is installed along the radial direction of the rotation table 2. The thermocouples 44a to 44c are arranged from the central portion side of the rotation table 2 to a periphery side thereof along the radial direction of the rotation table 2. The thermocouples 44a to 44c are installed to correspond to temperature measuring positions measured by thermocouples 14a to 14c (to be described later) installed in a rotation table 2 side. The thermocouples 44a to 44c measure temperatures of positions in an installation region of the heater 33, which correspond to the central portion side (the thermocouple 14a) and the periphery side (the thermocouple 14c) of the rotation table 2 and a position therebetween (the thermocouple 14c). The thermocouples 44a to 44c are connected to a main body of a temperature measuring device (not illustrated), and temperature measurement results in each position is output to a heater controller 72 to be described later.

Each of the heater elements 331 is installed to float from and substantially in parallel with the lower surface of the concave portion 31 when viewed from the side. Both ends of the heater element 331 are bent downwards. The heater element 331 is connected to a power supply part 333 installed outside of the vacuum container 11 through a connection port 332 passing through a lower plate of the container body 13 (regarding the power supply part 333, see FIG. 6). As a result, it is possible to divide the installation region of the heater 33 formed in a circular ring shape into several regions in the radial direction and control the output of the heater 33 for each concentric-circle-shaped divided region. In the drawings other than FIG. 4, the bent portion of the heater element 331 and the connection port 332 are omitted. The upper surface of the concave portion 31 where the heater 33 is installed is covered by a heater cover 34 which is, for example, an annular plate member made of quartz (see FIG. 1).

In the lower surface of the container body 13, exhaust ports 35 and 36 for discharging the interior of the vacuum container 11 are opened at the outer periphery side of the concave portion 31. A vacuum exhaust mechanism (not illustrated) constituted by a vacuum pump and so forth is connected to the exhaust ports 35 and 36.

As illustrated in FIGS. 2 and 3, in the side wall of the container body 13, a loading/unloading gate 37 of the wafer W and a gate valve 38 for opening and closing the loading/unloading gate 37 are installed. The wafer W held in an external transfer mechanism is loaded into the vacuum container 11 through the loading/unloading gate 37. In the upper surface of the rotation table 2, a plurality of concave portions 25 forming a mounting area of the wafers W is formed to surround the circumference of the flow path 18 in the central portion. The wafers W loaded into the vacuum container 11 are mounted in respective concave portions 25. The delivery of the wafers W between the transfer mechanism and the concave portions 25 is conducted by elevating pins (not illustrated) capable of moving between above and below the rotation table 2 through through-holes (not illustrated) installed in the respective concave portions 25. Detailed description on the elevating pins is omitted.

As illustrated in FIGS. 2 and 3, above the rotation table 2, a source gas nozzle 51, a separating gas nozzle 52, an oxidizing gas nozzle 53, a plasma gas nozzle 54 and a separating gas nozzle 55, in this order, are installed at intervals along a rotating direction of the rotation table 2. The gas nozzles 51 to 55 are formed in a bar shape horizontally extending in the radial direction from the side wall of the vacuum container 11 to the central portion of the rotation table 2. In lower surfaces of the respective gas nozzles 51 to 55, a plurality of discharge openings 56 are formed at intervals. Gases are discharged downward from the discharge openings 56.

In the description below, a direction along the rotating direction of the rotation table 2 from a predetermined reference position is referred to as a downstream side of the rotating direction, and the reverse direction is referred to as an upstream side of the rotating direction.

The source gas nozzle 51 discharges the aforementioned BTBAS gas toward the upper surface side of the rotation table 2. As illustrated in FIGS. 2 and 3, the source gas nozzle 51 is covered with a nozzle cover 57 formed in a fan shape widening from the source gas nozzle 51 toward the upstream side and the downstream side of the rotating direction of the rotation table 2. The nozzle cover 57 serves to a concentration of the BTBAS gas below the nozzle cover 57, thereby increasing adsorptivity of the BTBAS gas to the wafer W. The oxidizing gas nozzle 53 discharges the ozone gas, and the separating gas nozzles 52 and 55 discharge the $N_2$ gas. As illustrated in FIG. 2, the separating gas nozzles 52 and 55 are installed to divide the fan-shaped protrusion portions 17 formed in the ceiling plate 12 in the circumferential direction, respectively.

Next, a configuration of a plasma processing part 61, which performs a plasma process with respect to a film formed on the wafer W, will be described.

The plasma gas nozzle 54 discharges a plasma generating gas constituted by a mixture gas of, for example, an argon (Ar) gas and an oxygen ($O_2$) gas. As illustrated in FIG. 2 by the dashed line, an opening part having a fan shape is formed in the ceiling plate 12 along the rotating direction of the rotation table 2. In the opening part, the plasma processing part 61 made of a dielectric such as quartz or the like is inserted (see FIGS. 1 and 2). The plasma processing part 61 has a planar shape corresponding to the opening part, and has a vertical sectional shape of a cup shape. The plasma processing part 61 is installed between the oxidizing gas nozzle 53 and the protrusion portion 17 at the downstream side of the oxidizing gas nozzle 53 when viewed from the rotating direction of the rotation table 2.

As illustrated in FIG. 1, in a lower surface of the plasma processing part 61, a protrusion portion 62 is formed along a peripheral portion of the plasma processing part 61. The plasma gas nozzle 54 is inserted, along the protrusion portion 62 at the upstream side, to a region surround by the protrusion portion 62 so as to discharge a gas to the region. The protrusion portion 62 serves to suppress the $N_2$ gas, the ozone gas, and the BTBAS gas from entering below the plasma processing part 61, thereby minimizing a decrease in concentration of the plasma generating gas.

A concave portion is formed in an upper surface side of the plasma processing part 61. In the concave portion, a box-shaped faraday shield 63 with an open top is installed. In a lower surface of the faraday shield 63, an insulating plate member 64 is installed. A plasma generating antenna 65, which is formed by winding a metallic wire around a vertical axis in a coil shape and connected to a high-frequency power supply 66, is installed in an upper surface side of the faraday shield 63.

As illustrated in FIG. 2, a slit 67 is formed in the lower surface of the faraday shield 63. The slit 67 makes the magnetic field component of the electromagnetic field, which is generated in the antenna 65 when a high-frequency power is applied to the antenna 65, head downward while preventing the electric field component from heading downward. The slit 67 extends in a direction orthogonal to (intersecting) a winding direction of the antenna 65, and a plurality of slits 67 is formed along the winding direction of the antenna 65.

As illustrated in FIGS. 2 and 3, in the upper surface side of the rotation table 2, a region below the nozzle cover 57 of the source gas nozzle 51 is the adsorption region R1 where adsorption of the BTBAS gas as the source gas is performed, and a region below the oxidizing gas nozzle 53 is the oxidization region R2 where oxidization of the BTBAS gas by the ozone gas is performed. The adsorption region R1 and the oxidization region R2 correspond to the gas supply region of the present embodiment. A region below the plasma processing part 61 corresponds to a plasma generation region R3 where modification of the SiO$_2$ film by the plasma is performed. Regions below the protrusion portions 17 from separation regions D which separate the adsorption region R1 and the oxidization region R2 from each other by the N$_2$ gas discharged from the separating gas nozzles 52 and 55. The separation regions D prevent the source gas and the oxidization gas from being mixed.

Here, the exhaust port 35 at one side formed on the lower surface of the container body 13 is disposed in a vicinity of a boundary between the adsorption region R1 and the separation region D adjacent to the downstream side of the rotating direction with respect to the adsorption region R1. The exhaust port 35 is open to the outside of the rotation table 2 and discharges the surplus BTBAS gas. The exhaust port 36 at the other side is disposed in a vicinity of a boundary between the plasma generation region R3 and the separation area D adjacent to the downstream side of the rotating direction with respect to the plasma generation region R3. The exhaust port 36 is open to the outside of the rotation table 2, and discharges the surplus ozone gas and the surplus plasma generating gas. From the exhaust ports 35 and 36, the N$_2$ gases supplied from the respective separation regions D, the gas supply pipe 15 disposed below the rotation table 2, and the central region C of the rotation table 2 are also discharged.

Figure 6:
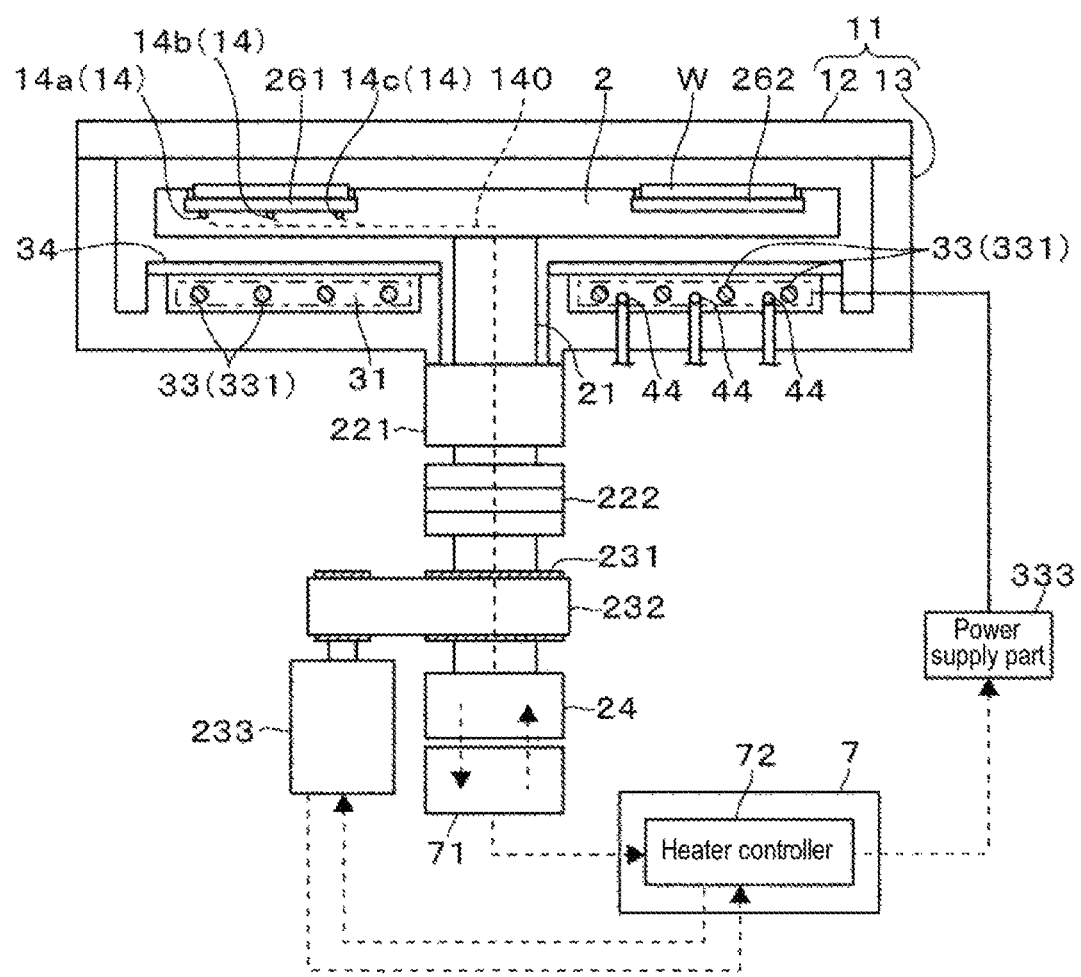
FIG. 6 is a vertical sectional side view illustrating the arrangement of the thermocouple and the shield member.

The film forming apparatus 1 is provided with a controller 7 implemented by a computer for controlling overall operations of the apparatus (see FIGS. 1 and 6). In the controller 7, a program for performing the film forming process on the wafer W is stored. The program transmits control signals to respective components of the film forming apparatus 1, thereby controlling operations of the components. Specifically, adjustment of supply amounts of various gases from the respective gas nozzles 51 to 55, output control of the heater 33, adjustment of supply amount of N$_2$ gas from the gas supply pipe 15 and the central region C, adjustment of a rotation speed of the rotation table 2 rotated by the driving motor 233, and so forth are performed according to the control signals. The program includes step groups for executing controls to perform the aforementioned operations. The program is installed in the controller 7 from a storage medium such as a hard disk, a compact disk, a magneto-optical disk, a memory card, a flexible disk, and so forth.

Figure 5:
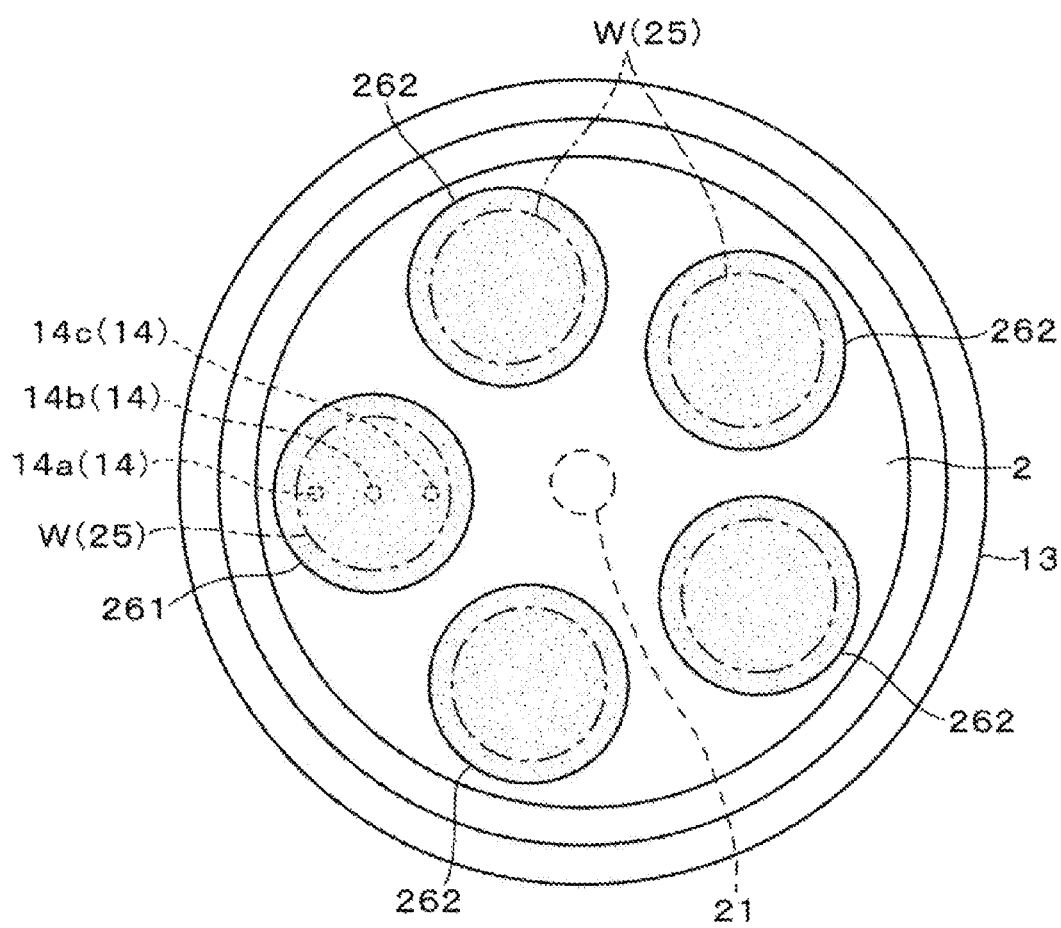
FIG. 5 is a plan view illustrating an arrangement of a thermocouple and a shield member with respect to a rotation table.

In the film forming apparatus 1 having the configuration described above, the rotation table 2 is heated by the heater 33, and the wafers W mounted in the respective concave portions 25 are heated through the rotation table 2. As illustrated in FIGS. 5 and 6, a plurality of thermocouples 14 (the thermocouples 14*a* to 14*c*), which are temperature measurement terminals, is installed in the rotation table 2 of the present embodiment. The temperature of the rotation table 2 is measured by using the thermocouples 14, and the temperature control of the rotation table 2 is performed by using the measured result. On the other hand, as described above, if the thermocouple 14 is installed in a position where the thermocouple 14 is influenced by plasma when the thermocouple 14 is passing through the plasma generation region R3, there is a possibility that abnormal discharge from the plasma toward the thermocouple 14 is generated. Also, there is a possibility that the electric signal output as a temperature measurement result is changed by an influence of the plasma and changed. In such a case, a correct temperature measurement result is not obtained.

Therefore, in the film forming apparatus 1 of the present embodiment, a plasma shield part (hereinafter, simply referred to as "shield part") 261 made of conductive material is installed in a region where the thermocouple 14 is installed so as to cover the thermocouple 14 when viewed from the plasma generation region R3.

Hereinafter, with reference to FIGS. 5 to 7, description will be made on a method of measuring a temperature of the rotation table 2 by the thermocouples 14 while suppressing an influence from the plasma using the shield part 261, and a temperature control of the rotation table 2 by using the thermocouples 14.

As schematically illustrated in FIGS. 5 and 6, in the rotation table 2 of the present embodiment, the three thermocouples 14 (14*a* to 14*c*) are installed in one of the five concave portions 25 forming the mounting area of the wafer W. The thermocouples 14*a* to 14*c* are arranged in a line along the radial direction of the rotation table 2 in an inner side of the concave portion 25. In the present embodiment, the thermocouples 14 are installed at a position of the central portion side of the rotation table 2 (the thermocouple 14*c*), at a position of a peripheral portion side of the rotation table 2 (the thermocouple 14*a*) and at a middle position between the two aforementioned positions (the thermocouple 14*b*). Each of the thermocouples 14*a* to 14*c* is installed to protrude upward from the lower surface of the concave portion 25.

If the wafer W is directly mounted in the concave portion 25 where the thermocouples 14*a* to 14*c* are installed, there is a possibility that, due to the influence of the plasma, abnormal discharge is generated or a correct temperature measurement result is not obtained. Therefore, the shield part 261 is installed to cover upper surfaces of the thermocouples 14*a* to 14*c*.

The shield part 261 of the present embodiment is a circular-shaped sheet, which is made of carbon as a conductor and has a thickness of about 5 to 10 mm. The shield part 261 is fixedly installed to cover the lower surface of the concave portion 25 so that the shield part 261 is placed between the thermocouples 14a to 14c and the wafer W when the wafer W is mounted in the concave portion 25. Each of the thermocouples 14a to 14c installed to protrude from the lower surface of the concave portion 25 is in contact with a lower surface of the shield part 261, thereby performing the temperature measurement of the rotation table 2 through the shield part 261. The thermocouples 14a to 14c are not necessarily in a state of making contact with the lower surface of the shield part 261. For example, the shield part 261 may be placed at the upper surface side of the concave portion 25 while the thermocouples 14a to 14c are buried in the lower side of the rotation table 2 near the lower surface of the concave portion 25.

In general, the plasma is easily causes discharge toward a pointed portion, and thus the upper surface of the shield part 261 is made flat. Further, a contour shape of the shield part 261 when viewed from the top is a circular shape like the wafer W and the concave portion 25, and is formed only with a curve having a curvature as large as possible. As a result, abnormal discharge, which may be generated toward corner portions if the contour shape of the shield part 261 is, for example, a rectangular shape, can be prevented from being generated.

When the shield part 261 as a conductor passes through the plasma generation region R3, the electric potential difference in a skin portion of the shield part 261 is small, and thus abnormal discharge is hardly generated. Further, the electric field is generated only in the skin portion of the shield part 261 as a conductor, and does not reach to the inner portion of the shield part 261 (skin effect). Therefore, by installing the thermocouples 14a to 14c in a rear surface side of the shield part 261 where the electric field is not formed, it is possible to shield the thermocouples 14a to 14c from the plasma, thereby suppressing the influence of the plasma.

In the skin portion of the shield part 261 where the electric potential difference is generated by the influence of the plasma, an eddy current is generated so as to cancel the electric field, and the shield part 261 is heated along with the generation of the eddy current. Therefore, in the region where the shield part 261 is installed, the rotation table 2 is heated by the heat generated by the shield part 261 as well as by the heat from the heater 33.

If the shield part 261 is installed only in the concave portion 25 where the thermocouples 14 are installed, a heating condition of the wafer W becomes different between the concave portion 25 where the shield part 261, which is heated when passing through the plasma generation region R3, is installed and the concave portions 25 where the shield part 261 is not installed. Therefore, in the rotation table 2 of the present embodiment, conductive sheets 262 constituted by carbon sheets identical with the shield part 261 are installed in the concave portions 25 where the thermocouples 14 are not installed. Like the shield part 261, the conductive sheets 262 are also heated when passing through the plasma generation area R3. As a result, the wafer W can be heated under the same condition as that in the concave portion 25 where the shield part 261 is installed.

As illustrated in FIG. 6, electromotive forces are generated from the thermocouples 14a to 14c, which are constituted by contacting different metals, according to the temperature of the rotation table 2 (the temperature of the shield part 261), and is taken out by a signal line 140 connected to the thermocouples 14a to 14c. For example, the signal line 140 is wired, in the rotation table 2, toward the central portion side of the rotation table 2 in the radial direction, and then is inserted into the rotation shaft 21. The signal line 140 passing through the rotation shaft 21 is taken out from a vacuum atmosphere to an atmospheric atmosphere through the feed through 222, and then is connected to the temperature detection unit 24 installed in the lower end portion of the rotation shaft 21.

The temperature detection unit 24 includes a voltmeter, a converting part, an output part, a transmission part, and so forth. The voltmeter detects the electromotive forces of the respective thermometers 14a to 14c input through the signal line 140. The converting part converts the electromotive forces into temperature information corresponding to the temperatures of the rotation table 2. The output part outputs the temperature information as, for example, serial data in which identifiers are labeled so as to identify the temperature information, which is obtained from the three different thermocouples 14a to 14c, from one another. The transmission part transmits the data output from the output part to the reception power supply unit 71 via wireless communication.

The reception power supply unit 71 is arranged to be adjacent to the temperature detection unit 24. The reception power supply unit 71 corresponds to a receiver that receives the temperature information transmitted from the temperature detection unit 24, and outputs the received temperature information to a heater controller 72 installed in the controller 7. Each of the temperature detection unit 24 and the reception power supply unit 71 includes a coil that transmits and receives a driving power of the temperature detection unit 24 by non-contact power supply. The power supplied from a power supply part (not illustrated) to the temperature detection unit 24 through the reception power supply unit 71 is accumulated in, for example, a battery installed in the temperature detection unit 24, and is used for operations of respective devices in the temperature detection unit 24.

Subsequently, description will be made on a method of performing a temperature control of the rotation table 2 using the temperature measurement result measured by the thermocouples 14 installed in the rotation table 2 side and the thermocouples 44 installed in the installation region side of the heater 33. As illustrated in FIG. 6, the controller 7 includes the heater controller (heating control part) 72 which perform the temperature control of the rotation table 2 based on the temperature measurement result obtained from the respective thermocouples 14 and 44. The heater controller 72 has a function of varying the power supplied from the power supply part 333 to the heater 33 (the respective heater elements 331) based on the temperature measurement result, thereby performing the output control of the heater 33 for each of the divided regions having a concentric circle shape.

Figure 7:
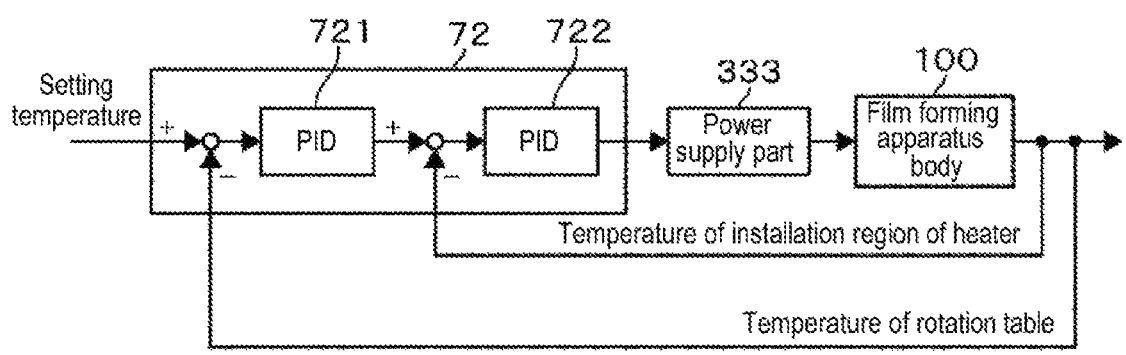
FIG. 7 is a block diagram illustrating an example of a temperature control mechanism of the rotation table.

FIG. 7 is a block diagram illustrating an example of a mechanism which performs the temperature control of the rotation table 2 in the heater controller 72. For convenience of explanation, in FIG. 7 and FIG. 11 to be described later, the entire film forming apparatus 1 except for the heater controller 72 and the power supply part 333 is collectively indicated as a "film forming apparatus body 100".

The heater controller 72 of the present example employs a cascade control wherein the output of the heater 33 is controlled based on the temperature of the rotation table 2 and the temperature of the installation region of the heater 33 measured by using the thermocouples 14 and 44, respectively.

Specifically, a first PID controller 721 calculates a target temperature of the installation region of the heater 33 based on a difference between a setting temperature of the rotation table 2 and the temperature of the rotation table 2 obtained from the thermocouples 14. A second PID controller 722 calculates a power to be supplied from the power supply part 333 to the heater 33 based on a difference between the target temperature and the temperature of the installation region of the heater 33 obtained from the thermocouples 44. The second PID controller 722 outputs the result to the power supply part 333, whereby the output control of the heater 33 is performed. The cascade loop illustrated in FIG. 7 is executed for each of three sets of temperature measurement positions, i.e., for each of the measurement positions where the temperature is measured by the thermocouples 14a to 14c installed in the concave portion 25 and measurement positions where the temperature is measured by the thermocouples 44a to 44c installed, correspondingly to the former measurement positions, in the installation region of the heater 33.

As already described above, the thermocouples 14 that performs the temperature measurement of the rotation table 2 are covered with the shield part 261, and thus are configured to be hardly influenced by the plasma in the plasma generation region R3. However, there is a possibility that the influence of the plasma is not completely eliminated. For example, the electric potentials output from the thermocouples 14 may be influenced by the plasma when the signal line 140 disposed in the rotation table 2 passes through the plasma generation region R3.

Figure 8:
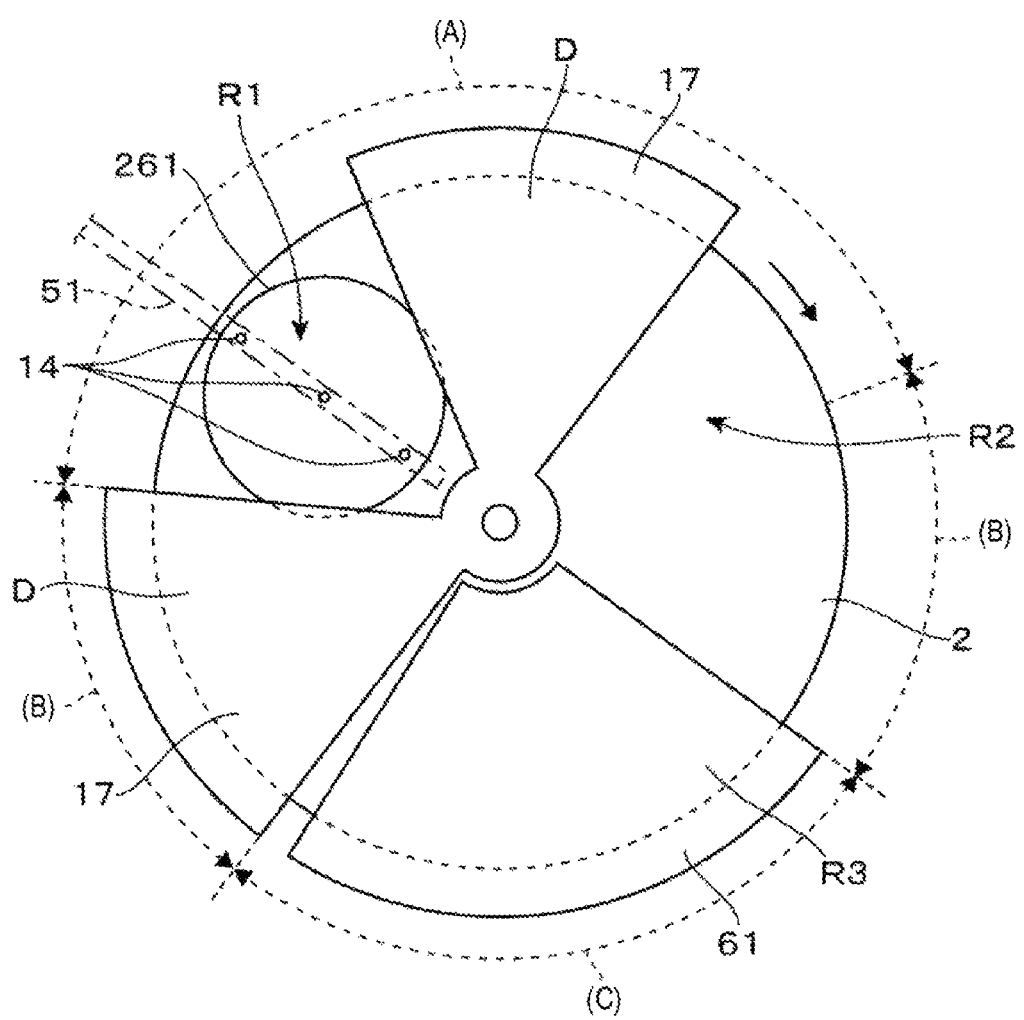
FIG. 8 is an explanatory view illustrating a use range of a temperature measurement result when the rotation table is rotated.

Therefore, the heater controller 72 of the present example divides the region through which the vacuum container 11 passes into a region where the temperature measurement of the rotation table 2 is performed and a region where the temperature measurement of the rotation table 2 is not performed, and adjusts the output of the heater 33 based on the result of the temperature measurement obtained in the region where the temperature measurement is performed. Specifically, as illustrated in FIG. 8, a range from an exit of the separation region D at the adsorption region R1 side to a position near the downstream side of the oxidization region R2 is set to be a temperature measurement region (A). The temperature measurement results measured in the plasma generation region R3 (plasma generation region (C)) and buffer regions (B) set to be placed in front and rear of the plasma generation region R3 (plasma generation region (C)) are not used to adjust the output of the heater 33.

The position of the thermocouples 14 when the rotation table 2 is rotated is recognized correspondingly to, for example, the rotation position of a rotation axis of the driving motor 233. The rotation position of the rotation axis is recognized by a rotary encoder (not illustrated) installed in the driving motor 233. The heater controller 72 recognizes the current position of the thermocouples 14 installed in the rotation table 2 in the course of rotation based on the output of the rotary encoder, and performs the aforementioned output control of the heater 33 by using the temperature measurement result obtained during a period when the thermocouples 14 are located in the temperature measurement region (A). In this case, the rotary encoder of the driving motor 233 corresponds to a position detection part that detects the position of the thermocouples 14.

Determination of whether the temperature measurement result is usable or not based on the position of the thermocouples 14 is not limited to be performed by the heater controller 72, but may be performed by the temperature detection unit 24 side. In this case, for example, the temperature detection unit 24 is configured to obtain information of the rotary encoder from the driving motor 233 via the reception power supply unit 71. As a result, the temperature detection unit 24 can output only the temperature measurement result obtained during the period when the thermocouples 14 are located in the temperature measurement region (A), based on the position of the thermocouples 14 recognized from the output of the rotary encoder.

Operations of the film forming apparatus 1 having the aforementioned configuration will be described.

First, the film forming apparatus 1 adjusts the inner pressure of the vacuum container 11 and the output of the heater 33 to a condition for loading the wafer W, and waits to load the wafer W. After the wafer W to be processed is transferred by, for example, a transfer arm installed in an adjacent vacuum transfer chamber, the gate valve 38 is opened. The transfer arm enters the vacuum container 11 through the open loading/unloading gate 37, and mounts the wafer W in the concave portion 25 of the rotation table 2. This operation is repeated until the wafers W are mounted in the respective concave portions 25 while rotating the rotation table 2 intermittently.

When the load of the wafer W is completed, the transfer arm is retracted from the interior of the vacuum container 11 and the gate valve 38 is closed. Thereafter, the interior of the vacuum container 11 is vacuum-exhausted to a predetermined pressure by an exhaust from the exhaust ports 35 and 36. Predetermined amounts of $N_2$ gas is supplied from the separation gas nozzles 52 and 55, the flow path 18 in the central region C, and the gas supply pipe 15 in the lower side of the rotation table 2, respectively. The rotation table 2 starts to be rotated, and the rotation speed is adjusted to be a predetermined value of higher than 0 rpm and equal to or lower than 300 rpm.

The power supply part 333 starts to supply power to the heater 33 and the temperature control of the rotation table 2 is performed. In other words, as illustrated in FIG. 7, the setting temperature of the rotation table 2 is input to the heater controller 72, and is compared with the temperature of the rotation table 2 measured by the thermocouples 14. After that, a control loop for adjusting the output of the heater 33 is performed in the sequential steps of: calculating the target temperature of the installation region of the heater 33 by the first PID controller 721→comparing with the temperature of the installation region measured by the thermocouples 44→calculating the supply power to the heater 33 by the second PID controller 722→adjusting the supply power from the power supply part 333→varying the output of the heater 33.

In performing the temperature control, since the thermocouples 14 that measure the temperature of the rotation table 2 are covered with the shield part 261 when viewed from the plasma generation region R3, generation of the abnormal discharge when passing through the plasma generation region R3 can be suppressed. The temperature of the rotation table 2 measured by using the thermocouples 14 is wirelessly transmitted from the temperature detection unit 24 installed in the lower end portion of the rotating thermocouples 14 to the reception power supply unit 71, and then is output to the heater controller 72.

Figure 9:
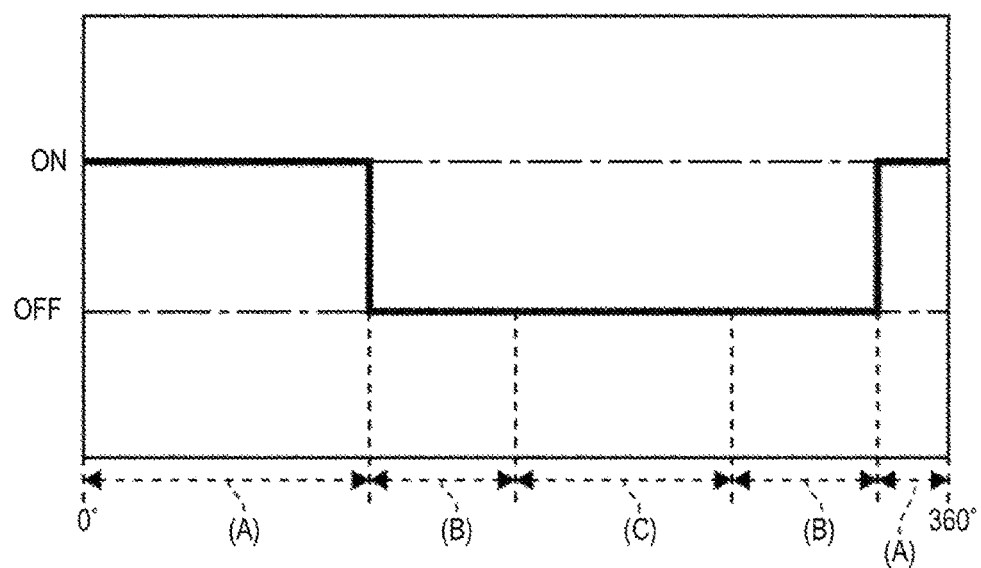
FIG. 9 is a timing chart illustrating a timing of use and not-use of the temperature measurement result obtained by the thermocouple.

In order to avoid the influence of the plasma on the entire devices performing the temperature measurement, the output control of the heater 33 is performed by using only the temperature measurement result obtained during the period when the thermocouples 14 pass through the temperature measurement region (A) illustrated in FIG. 8. As a result, as illustrated in FIG. 9, an operation of using the temperature measurement result of the rotation table 2 measured by the thermocouples 14 in the temperature control of the rotation table 2 is turned-on and turned-off. During the turned-off period, the temperature measurement result measured during the turned-on period just prior to the turned-off period may be fetched to a register or the like and used in the temperature control of the rotation table 2.

The horizontal axis in FIG. 9 denotes a circumferential position of the thermocouples 14 when the container body 13 is viewed from the top, wherein a position of the thermocouples 14 when passing through the lower side of the source gas nozzle 51 is set to 0°. Symbols (A) to (C) in FIG. 9 correspond to the regions (A) to (C) illustrated in FIG. 8, respectively.

In the concave portions 25 where the thermocouples 14 are not installed, the conductive sheets 262, which are constituted by carbon sheets identical with the shield part 261 that is heated when passing through the plasma generation region R3, are arranged. When the shield parts 261 and the conductive sheets 262 pass through the plasma generation region R3, the carbon sheets are equally heated. Therefore, heating conditions of the respective wafers W can be made uniform in the respective concave portions 25 installed in the rotation table 2. In addition to being heated by the heater 33, the temperature of the rotation table 2 measured by the thermocouples 14 is affected by the heat generated by the shield part 261 (the conductive sheet 262 in the concave portion 25 where the thermocouples 14 are not installed).

If the temperature of the rotation table 2 reaches to the setting temperature by the aforementioned temperature control, supply of various gases (the source gas, the oxidization gas, and the plasma generating gas) from the source gas nozzle 51, the oxidizing gas nozzle 53, and the plasma gas nozzle 54 and generation of plasma by applying of the high-frequency power from the high-frequency power supply 66 to the antenna 65 are started. Each of the gases is supplied at a flow rate according to a selected process recipe.

As a result, the wafers W mounted in the respective concave portions 25 of the rotation table 2 repeatedly passes through: the adsorption region R1 below the nozzle cover 57 of the source gas nozzle 51→ the oxidization region R2 below the oxidizing gas nozzle 53→ the plasma generation region R3 below the plasma processing part 61, in this order.

In the adsorption region R1, the BTBAS gas discharged from the source gas nozzle 51 is adsorbed to the wafer W. In the oxidization region R2, the adsorbed BTBAS gas is oxidized by the ozone gas supplied from the oxidizing gas nozzle 53. Therefore, one molecular layer or a plurality of molecular layers of $SiO_2$ film is formed. In the plasma generation region R3, the molecular layer of $SiO_2$ film is exposed to the plasma and modified.

In this state, if the rotation table 2 continues to be rotated, the molecular layer of $SiO_2$ film is sequentially deposited on the surface of the wafer W. Thus, the $SiO_2$ film is formed and the film thickness of the $SiO_2$ film gradually increases.

At this time, the adsorption region R1 and the oxidization region R2, and the plasma generation region R3 and the adsorption region R1 are separated by the respective separation regions D and the flow path 18. Therefore, deposits attributable to contact of the source gas and the oxidization gas are hardly generated in unnecessary locations.

At a timing when the $SiO_2$ films having a desired film thickness is formed on the respective wafers W, e.g., the timing when the rotation number of the rotation table 2 reaches a predetermined value, supply of the various gases from the source gas nozzle 51, the oxidizing gas nozzle 53, and the plasma gas nozzle 54 and application of the high-frequency power from the high-frequency power supply 66 to the antenna 65 are stopped. Then, rotation of the rotation table 2 is stopped and the output of the heater 33 is set to a standby state, thereby completing the film forming process.

At this time, the rotation table 2 loses heat by the $N_2$ gas supplied from the respective parts, and the temperature of the rotation table 2 decreases. Instead of stopping the heater 33, the rotation table 2 may be maintained in a preheated state during this temperature-decreasing period. In this case, like the control during the temperature-increasing period of the rotation table 2 as described above with reference to FIGS. 7 and 9, the adjustment of the output of the heater 33 may be performed using the temperature measurement result of the rotation table 2 measured by the thermocouples 14.

After that, the inner pressure of the vacuum container 11 is adjusted to a condition for unloading the wafer W, and a gate valve 38 is opened. The wafer W is taken out in a reverse order to the order of loading the wafer W, thereby completing the film forming process.

The film forming apparatus 1 according to the present embodiment has the effects to be described below. In the film forming apparatus 1 that forms a film with respect to the wafer W mounted in the rotation table 2, the plasma processing part 61 for performing a plasma treatment on the formed film is installed. Further, the thermocouples 14, which measure the temperature of the rotation table 2 and outputs the measurement result as an electric signal, is installed in the rotation table 2. When viewed from the plasma processing part 61, the thermocouples 14 are covered with the shield part 261 constituted by a carbon sheet. By an act of the shield part 261, the temperature of the rotation table 2 is precisely measured while suppressing generation of an abnormal discharge from the plasma toward the thermocouples 14.

Further, by installing the thermocouples 14 in the rotation table 2 and using the result of directly measuring the temperature of the rotation table 2 in the temperature control of the rotation table 2, the effect described below can be obtained.

In a conventional case where the temperature of the rotation table 2 cannot be measured directly, the temperature of the installation region of the heater 33 is recognized by using the thermocouples 44 illustrated in FIGS. 4 and 6, and then the film forming apparatus 1 is kept in a standby state until a sufficient time elapses after the temperature of the installation region reaches a setting temperature. In contrast, since the film forming apparatus 1 of the present embodiment can directly measure the temperature of the rotation table 2 by using the thermocouples 14, the standby time, i.e., a predetermined period of time for waiting even after the rotation table 2 has reached the setting temperature, is not necessary. Therefore, it is possible to shorten the entire processing time from the loading of the wafer W into the film forming apparatus 1 to the unloading of the wafer W.

Further, by installing the thermocouples 14 in the rotation table 2, it is possible to recognize the temperature of the rotation table 2 in real time. Thus, it is possible to use the temperature measurement result in the temperature control of the rotation table 2 using the heater 33. As a result, by increasing the output of the heater 33 using feedback of the temperature of the rotation table 2, the time until the temperature of the rotation table 2 reaches the setting temperature can be shortened.

Figure 10:
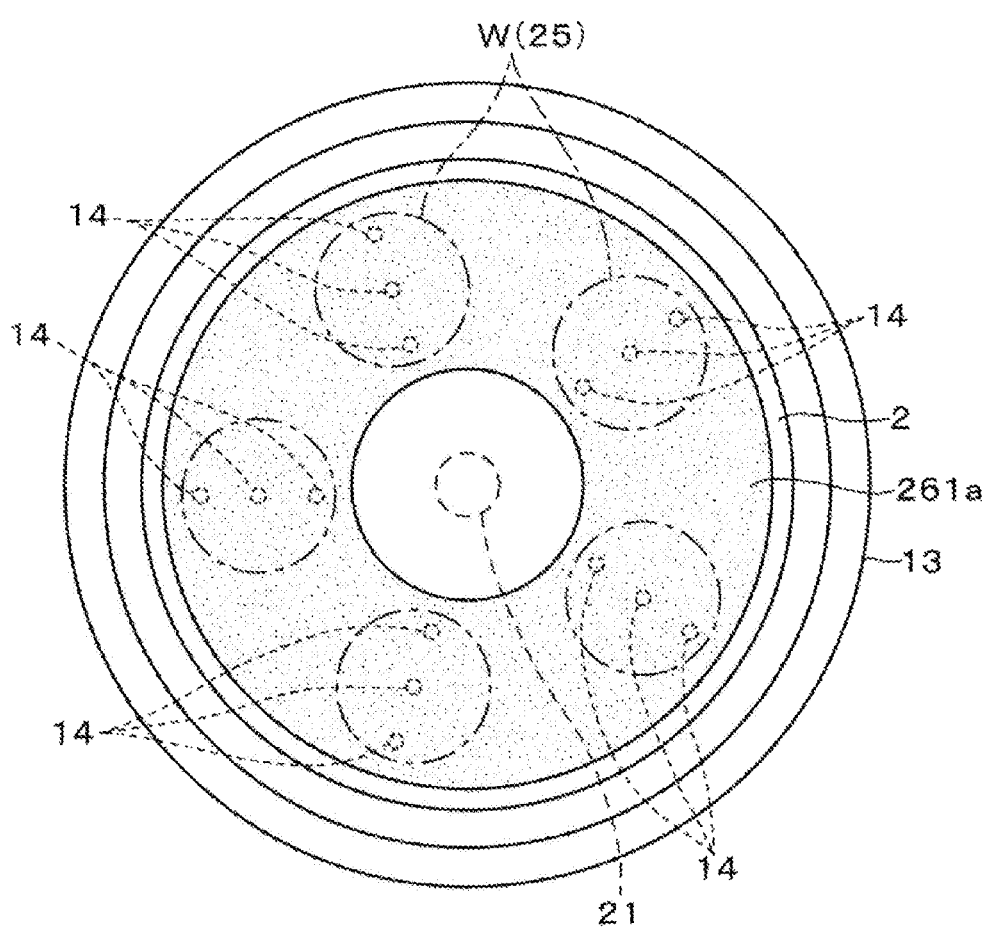
FIG. 10 is a plan view illustrating another example of the arrangement of the thermocouple and the shield member.

The position where the thermocouples 14 are installed or the shape of the shield part 261 is not limited to the example illustrated in FIG. 5. For example, FIG. 10 illustrates another example. In this example, three thermocouples 14 are arranged in a line along the radial direction of the rotation table 2 in each of the concave portions 25, and an annular shield part 261*a* is installed to cover the region from the center side of the rotation table 2 to the peripheral portion side thereof. In other words, in this example, lower surfaces of all concave portions 25 are covered by one sheet of the shield part 261a. By installing the thermocouples 14 to each of the concave portions 25, the temperatures of the respective wafers W can be recognized delicately and precisely. Further, by using the annular shield part 261a, the heat generated when the shield part 261a passes through the plasma generation region is generated along the circumferential direction of the rotation table 2, and thus it is possible to perform uniform heating of the rotation table 2.

If the influence of the heat generated when the shield part 261 passes through the plasma generation region is small, the conductive sheet 262 is not necessarily installed in each of the concave portions 25.

Regarding materials constituting the shield parts 261 and 261a and the conductive sheets 262, if there is no problem such as an influence of metals with respect to the wafer W, the shield parts 261 and 261a and the conductive sheets 262 made of metal, such as aluminum, stainless steel, or the like may be used.

Configuration of the temperature measurement terminal installed in the rotation table 2 is not limited to the aforementioned example of the thermocouples 14. For example, as the temperature measurement terminal, a resistance temperature detector (RTD), a thermistor, or a semiconductor thermometer may be used.

The position where the temperature measurement terminal is installed is not limited to the inside of the concave portion 25 as a mounting area of the wafer W. The thermocouples 14 may be installed in the upper surface of the rotation table 2, which is outside of the concave portion 25, and the upper surface side of the rotation table 2 may be covered with the shield part 261 or 261a.

In order to prevent contamination attributable to a metal, if it is not preferable to process the wafer W in a space where the metal is exposed, for example, a container made of quartz may be installed inside of the vacuum container 11 and the rotation table 2 may be installed in the quartz container. In this case, it is unnecessary to install the aforementioned heater cover 34.

The method of performing the temperature control of the rotation table 2 in the heater controller 72 is not limited to the example of the cascade control described above with reference to FIG. 9, in which the output control of the heater 33 is performed by using the temperatures of the rotation table 2 and the installation of the heater 33. For example, as illustrated in FIG. 11, a single loop control mechanism, in which the output control of the heater 33 is performed based on the temperature measurement result of the rotation table 2 only, may be used.

Figure 11:
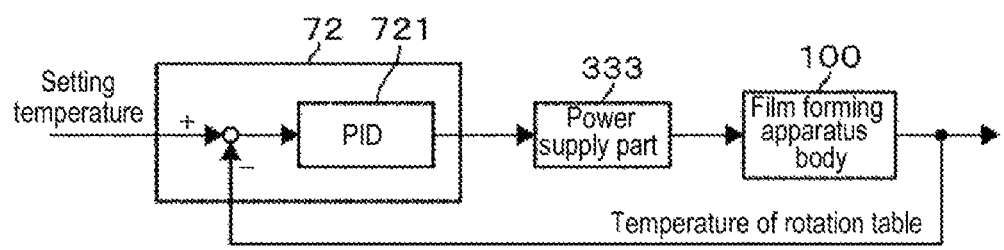
FIG. 11 is a block diagram illustrating another example of the temperature control mechanism of the rotation table.

In both of the control mechanisms illustrated in FIGS. 7 and 11, as described above with reference to FIGS. 8 and 9, switching between using and not-using the temperature measurement result measured by the thermocouples 14 in the output control of the heater 33, according to the position of the thermocouples 14 when the rotation table 2 is rotated is not necessarily performed. If a sufficient shield effect of the plasma is obtained by installing the shield part 261 or 261a, regardless of the position of the thermocouples 14, the output control of the heater 33 may be always performed by using the temperature measurement result of the rotation table 2 obtained from the thermocouples 14.

The method of extracting the electric signal of the temperature measurement result from the thermocouples 14 in the course of rotation is not limited to the wireless communication between the temperature detection unit 24 and the reception power supply unit 71. For example, a configuration, in which a slip ring is installed in the lower surface of the temperature detection unit 24 and the temperature information is output from the output part of the temperature detection unit 24 to the slip ring, may be used. In this case, the temperature information is extracted through a brush installed to make contact with a side surface of the slip ring, and is input to the reception power supply unit 71.

In the aforementioned embodiment, description has been made on an example in which the film forming apparatus 1 performs the $SiO_2$ film formation by an ALD method using the BTBAS gas as the source gas and the ozone gas as the oxidization gas. However, a type of the film forming process capable of being performed by using the film forming apparatus 1 of the present disclosure is not limited thereto. For example, an ALD process, in which aluminum nitride (AlN) is obtained by adsorbing the source gas such as trimethyl aluminium (TMA), triethyl aluminium (TEA), or the like to the wafer W in the adsorption region R1 and by nitriding the source gas by supplying a nitriding gas such as ammonia ($NH_3$) or the like to a nitridation region installed instead of the oxidization region R2, may be performed.

A type of the process performed within the heat treatment apparatus is not limited to the film formation process. Only of a modification process of a film passing through the plasma generation region R3 may be performed on a wafer W, which has been already subjected to a film formation process and mounted on the rotation table 2. In this case, only of the separation region D and the plasma generation region R3 may be formed in the ceiling plate 12, and the adsorption region R1 and the oxidization region R2 need not be formed in the rotation table 2.

According to the present disclosure, in the heat treatment apparatus that performs a heat treatment with respect to the substrate mounted in the rotation table, the plasma processing part for performing the plasma process with respect to the substrate is installed. Further, the temperature measurement terminal that measures the temperature of the rotation table and outputs the measurement result as an electric signal is installed in the rotation table. The temperature measurement terminal is covered with the plasma shield part made of a conductive material when viewed from the plasma processing part. By the act of the plasma shield part, it is possible to measure the temperature of the rotation table more precisely while suppressing generation of the abnormal discharge from the plasma toward the temperature measurement terminal.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus comprising:
    a rotation table installed in a vacuum container and configured to rotate by a driving motor, the rotation table mounting a substrate in each of a plurality of mounting areas and revolving the substrate, the plurality of mounting areas being formed in one surface side of the rotation table and arranged at intervals along a rotating direction of the rotation table;

a heater that heats the rotation table;
a plasma processing part located above the rotation table and configured to generate a plasma in a plasma generation region below the plasma processing part and process the substrate, the plasma processing part including a dielectric and a plasma generating antenna located above the dielectric;
one or more temperature measurement terminals installed in a set of mounting areas in the rotation table at a region that passes through the plasma generation region when the rotation table is rotated, the set of mounting areas including one or more mounting areas selected from the plurality of mounting areas, each of the temperature measurement terminals configured to measure a temperature of the rotation table and output a temperature measurement result of the rotation table as an electric signal;
one or more plasma shield parts made of an electric conductor, and installed to cover the one or more temperature measurement terminals when viewed from the plasma generation region and to cover the set of mounting areas where the one or more temperature measurement terminals are installed;
one or more conductive sheets made of the electric conductor, and installed to cover a remaining set of mounting areas where the one or more temperature measurement terminals are not installed;
a rotary encoder that outputs a rotation position of a rotation axis of the driving motor; and
a controller including a heater controller wherein the controller is configured to execute a program to perform a control to:
  recognize positions of the one or more temperature measurement terminals with respect to the plasma generation region when the rotation table is rotated, based on the output of the rotary encoder;
  determine whether the electric signal output from each of the one or more temperature measurement terminals is the temperature measurement result of the rotation table obtained during a period when a position of a corresponding one of the one or more temperature measurement terminals is outside of the plasma generation region, based on the recognized positions; and
  adjust an output of the heater based on the electric signal, which is determined to be the temperature measurement result of the rotation table measured when the position of the corresponding one of the one or more temperature measurement terminals is outside of the plasma generation region, to reach a predetermined setting temperature of the rotation table.

2. The heat treatment apparatus of claim 1, wherein when viewed from the plasma generation region side, a contour shape of each of the one or more plasma shield parts is formed with curves only.

3. The heat treatment apparatus of claim 1, wherein each of the one or more plasma shield parts has a flat surface facing the plasma generation region.

4. The heat treatment apparatus of claim 1, wherein the one or more plasma shield parts are installed in the set of mounting areas.

5. The heat treatment apparatus of claim 4, wherein the one or more temperature measurement terminals are installed to make contact with the one or more plasma shield parts, and measures the temperature of the rotation table through the one or more plasma shield parts.

6. The heat treatment apparatus of claim 1, further comprising:
  a rotation shaft that rotates the rotation table,
    wherein the electric signal is output outside via a signal line wired inside of the rotation shaft.

7. The heat treatment apparatus of claim 6, wherein a transmission part is installed in the rotation shaft and the transmission part transmits the electric signal to a receiver installed outside via wireless communication.

8. The heat treatment apparatus of claim 1, wherein the heater controller adjusts the output of the heater based on a difference between the temperature of the rotation table recognized using the one or more temperature measurement terminals and the predetermined setting temperature of the rotation table.

9. The heat treatment apparatus of claim 8, wherein the heater is installed in a lower side of the rotation table, heats the rotation table by thermal radiation, and includes a heater thermometer that measures a temperature of an installation region where the heater is installed;
  wherein the heater controller performs a cascade control in which a target temperature of the installation region is calculated based on the difference between the temperature of the rotation table recognized using the one or more temperature measurement terminals and the predetermined setting temperature of the rotation table, and in which the output of the heater is varied based on a difference between the temperature of the installation region measured by the heater thermometer and the target temperature of the installation region.

10. The heat treatment apparatus of claim 1, wherein the electric conductor is carbon.

11. The heat treatment apparatus of claim 1, wherein when the rotation table is rotated, each of the one or more plasma shield parts and the one or more conductive sheets is heated by plasma irradiation.

* * * * *